United States Patent
La Vecchia

(10) Patent No.: US 6,635,942 B2
(45) Date of Patent: *Oct. 21, 2003

(54) SEMICONDUCTOR ELEMENT, ESPECIALLY A SOLAR CELL, AND METHOD FOR THE PRODUCTION THEREOF

(76) Inventor: Nunzio La Vecchia, Monte Veritá, via Collina 93, CH-6612 Ascona (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/319,772

(22) PCT Filed: Oct. 23, 1998

(86) PCT No.: PCT/CH98/00455

§ 371 (c)(1),
(2), (4) Date: Jun. 11, 1999

(87) PCT Pub. No.: WO99/56325

PCT Pub. Date: Nov. 4, 1999

(65) Prior Publication Data

US 2003/0107099 A1 Jun. 12, 2003

(30) Foreign Application Priority Data

Apr. 29, 1998 (EP) .............................. 98810382

(51) Int. Cl.$^7$ .............................................. H01L 31/00
(52) U.S. Cl. ...................... 257/439; 257/53; 257/431; 136/258
(58) Field of Search .................... 257/43, 53, 431, 257/439; 136/258

(56) References Cited

U.S. PATENT DOCUMENTS

| | | | | |
|---|---|---|---|---|
| 3,852,563 A | * | 12/1974 | Bohorquez et al. | |
| 4,131,486 A | * | 12/1978 | Brandhorst, Jr. | 136/89 SJ |
| 4,589,918 A | * | 5/1986 | Nishida et al. | 75/244 |
| 4,649,227 A | * | 3/1987 | Tributsch et al. | 136/252 |
| 4,710,786 A | * | 12/1987 | Ovshinsky et al. | 357/2 |
| 4,766,471 A | * | 8/1988 | Ovshinsky et al. | 357/19 |
| 5,349,204 A | * | 9/1994 | Yamazaki | 257/53 |
| 5,482,570 A | * | 1/1996 | Saurer et al. | 136/255 |
| 5,824,434 A | * | 10/1998 | Kawakami et al. | 429/209 |

FOREIGN PATENT DOCUMENTS

DE            3526910        *    2/1986

OTHER PUBLICATIONS

O. Blenk et al., *Appl. Phys. Lett.*, 62(17), 2093–2095 (1993).
A. Ennaoui et al., *Solar Energy Materials and Solar Cells*, 29(4), 289–370 (1993).

* cited by examiner

*Primary Examiner*—Eddie Lee
*Assistant Examiner*—Eugene Lee

(57) ABSTRACT

A semiconductor component (50), in particular a solar cell, which has at least one semiconductor base material (40) consisting of a mono or a polycrystalline structure. The semiconductor base material (40) consists at least in part of pyrite with the chemical composition $FeS_2$ and which is cleaned for the purpose of achieving a defined degree of purity. Maximum benefit is drawn from the semiconductor base material (40) when it is produced from at least one layer of pyrite (51), at least one layer of boron (52) and at least one layer of phosphorous (53). An optimum type is derived from this semiconductor component when it is used as a solar cell.

12 Claims, 2 Drawing Sheets

Figure 1:
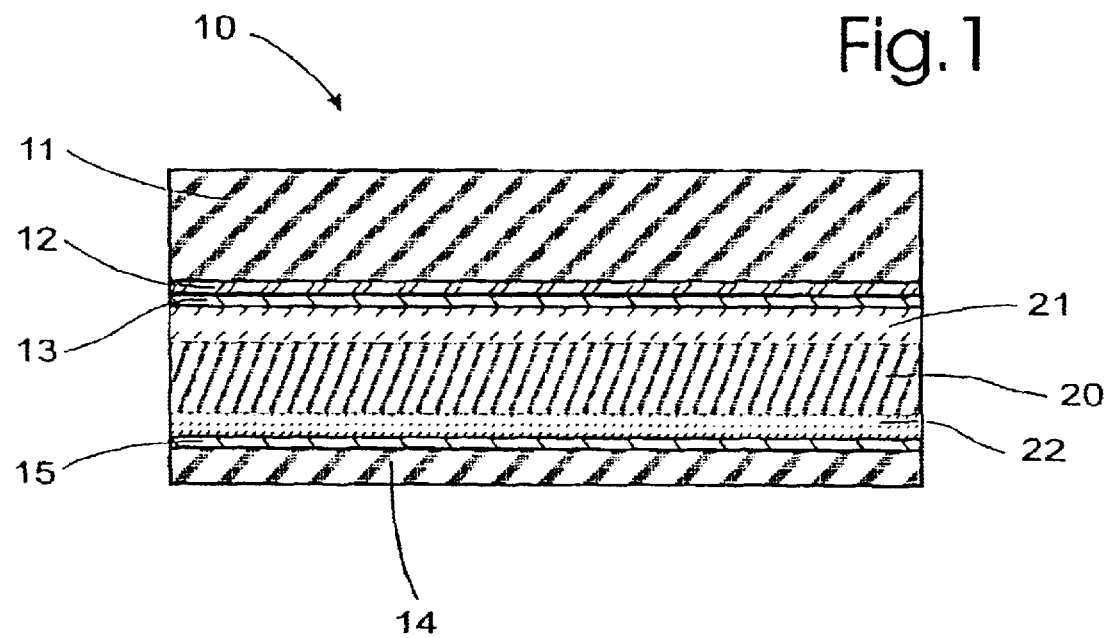

SEMICONDUCTOR ELEMENT, ESPECIALLY A SOLAR CELL, AND METHOD FOR THE PRODUCTION THEREOF

Semiconductor component, in particular a solar cell, and process for manufacture of same The invention concerns a semiconductor component, in particular a solar cell, with at least one semiconductor base material consisting of a mono or a polycrystalline structure, which consists at least in part of pyrite with the chemical composition $FeS_2$ and which is cleaned for the purpose of achieving a defined degree of purity.

A number of generic semiconductor components or semiconductor photocomponents are already recognized which, given an efficiency level of approximately 15%, are used commercially on the basis of the internal photo effect of radiation energy from the sun or from light. Thin silicon or gallium arsenide iron crystal with p and n conductive zones are used predominantly as semiconductor materials.

Thin-layered solar cells are also recognized, in the case of which the semiconductor layers are positioned on a carrier by means of metallization or similar to produce a thickness in the range of micrometers (1 to 50 $\mu$m). Materials such as cadmium sulphide, cadmium telluride, copper sulphide or similar are used for the semiconductor layers. These semiconductor components are only able to achieve an efficiency of 5–8%. However, they have a useful power-weight ratio and are essentially more cost-effective to produce than silicon-iron crystals.

According to Patent Specification EP-A 0 173 642, a generic solar cell is a photo-active pyrite layer with the chemical formula $FeS_{2+/-x}$, which has a concentration of undesirable impurities of $<10^{20}$ per cm$^3$ and a dopant of manganese (Mn) or arsenic (As) and/or cobalt (Co) or chlorine (Cl). In practice, it would appear that a solar cell with this composition cannot achieve the required efficiency level.

In contrast, the object of this invention is to create a semiconductor component, in particular a solar cell on the basis of the type mentioned above which can be used to achieve a higher efficiency than the known sun or light radiation. Furthermore, the production costs in respect of this semiconductor component will be sufficiently low that this type of solar cell would be suitable for mass production. A further object of the invention exists in using a semiconductor material which can be disposed of easily in an environmentally friendly manner.

The invention is able to meet the objective in that the semiconductor base material which consists at least in part of pyrite with the chemical composition $FeS_2$, is combined or doped at least with boron and phosphorus respectively.

With a very advantageous type, the semiconductor base material is produced from at least one layer of pyrite together with the elements boron and phosphorus. Used in this way, an optimum and extremely efficient composition is achieved, especially for solar cells.

These semiconductor components in accordance with the invention can be used to produce solar cells which have a higher efficiency than any other known solar cells. The pyrite used as a semiconductor material has the advantage of being a natural material which can also be produced synthetically. The production costs can be kept to a level such that, given the increased level of efficiency, profitable use can be drawn.

Type examples of the invention and further advantages of same are explained in more detail below with the aid of the drawing. This shows: FIG. 1 a schematic cross-section through a semiconductor component in accordance with the invention, shown on an enlarged scale, FIG. 2 a schematic view of the energy split of the Fe d-conditions in octahedral and deformed octahedral ligand field of the pyrite FIG. 3 a schematic cross-section through a semiconductor component in accordance with the invention with a heterojunction, shown on an enlarged scale and FIG. 4 a schematic view of the energy bands with a heterojunction of a semiconductor component in accordance with the invention.

FIG. 1 is a schematic of a semiconductor component 10 in accordance with the invention, which is formed in particular as a solar cell. In the type example shown, this semiconductor component 10 has a multi-layered structure and may for example, together with a number of adjacent cells, be clad in a metal casing formed as a panel, which is not shown in detail. The solar cell preferably has a cover plate from a transparent material, e.g. a layer of glass 11 or similar, which provides this cell with general protection against the effects of mechanical forces, such as impacts etc., against moisture and/or adverse weather conditions. A laminate layer 12, from resin for example, together with an insulator 14 arranged on the underside, e.g. as a ceramic plate, surrounds the solar cell, so that the inside of the solar cell is closed and therefore impervious to moisture, water or similar.

In accordance with the invention, the semiconductor base material 20 consists of pyrite or iron pyrite, which has a chemical composition of $FeS_2$. The semiconductor base material 20 is combined or doped with at least boron or phosphorus, whereby in the example shown, the semiconductor base material consists of a layer 20 of $FeS_2$.

This semiconductor component 10 formed as a solid state cell consists of one layer of the semiconductor base material 20 produced from pyrite, one layer of phosphorus 21 and one layer of boron 22. This layer of phosphorus 21 and this layer of boron 22 are applied to the corresponding surface of the layer of pyrite 20, in such a way that a bond within the sense of a dopant is produced between the semiconductor base material and the phosphorus (P) respective the boron (B). Preferably, these layers of phosphorus 21 and boron 22 are applied in a very thin layer of several micrometers through a process described below.

Thus, the required function of this semiconductor component 10 formed as a solar cell is derived, from which, together with sunlight radiation, an electric current is produced, which is expediently tapped by the conductive materials 13 and 15 which are arranged above and below the semiconductor layers by a recognized method, whereby the conductive material is protected by the insulator 14. These conductive materials are connected to a consumer unit or similar by means of cabling for which no diagrams are provided.

FIG. 1 is shown as a solar cell with a simple structure in accordance with the invention. Clearly, both the conductive materials and also the semiconductor layer can be provided in various configurations and in various quantities.

This type of semiconductor component can be used as various types of solar cell, either for very small cells, e.g. calculators, or for solar cells for heating houses and large-scale plants, in which case they are used in particular to convert solar energy into electrical energy.

Pyrite and iron pyrite as natural rocks are the most widespread sulphides on earth and these exist in Spain for example as a hydro-thermal ore area. The individual pyrite crystals are either brass or mortar coloured with a high degree of hardness, i.e. approx. 6 to 6.5 on the Mohs' hardness scale. Pyrite has a thermal expansion coefficient at 90 to 300 K of $4.5 \times 10^{-6}$ $K^{-1}$ and at 300 to 500 K of $8.4 \times 10^{-6}$ $K^{-1}$. The pyrite with a chemical composition of $FeS_2$ has an elementary cell of 12 atoms and a unit cell length of approximately 5.4185 Angstrom units. The typical basic shape of the crystal habitus of the pyrite is a hexahedral, a cubic shape, a pentagonal dodecagon or an octahedron. A further advantage of this semiconductor component is that this pyrite is extremely compatible with the environment.

In terms of the efficiency of this solar cell 10 as described by the invention, in accordance with the general rules of quantum mechanics, only those photons, the energy of which is at least equivalent to the width of the prohibited zone and no more than equivalent to the energy difference between the lower edge of the valence band and the upper edge of the conduction band, are effective. The quantity of resultant charge carriers is dependent not only on energy and the number of radiated photons per surface unit, but also on the absorption coefficient á of the semiconductor. Compared with traditional semiconductor materials, pyrite has a very high absorption coefficient, which, on the band edge with an absorption coefficient of $á > 10^5$ $cm^{-1}$, has a value of $\lambda < 1 \mu m$. By creating the semiconductor 10 in accordance with the invention, optimum use is made of these pyrite properties.

Figure 2:
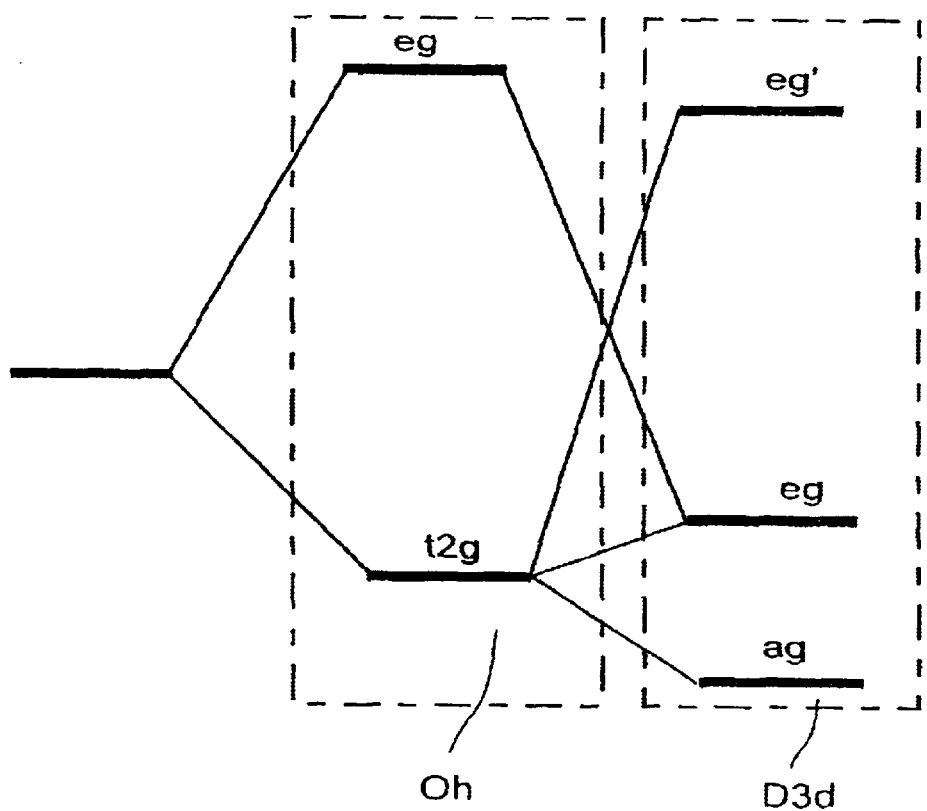

In accordance with FIG. 2, the energy split of the Fe d-conditions can be seen in the octahedral $O_h$ and deformed octahedral $D_{3d}$ ligand field of the pyrite. A band gap is created in the semiconductor base material by splitting the Fe d-conditions in occupied $t_{2g}$ and unoccupied $e_g$ conditions, whereby this band gap can be up to 0.7 eV or more. The valence band has a width of 0.8 eV or more and the basic group is separated by a gap, also of 0.8 eV. The conditions above the conduction band are based on Fe 4s and 4p conditions. In the area of the molecular orbital theory, the energy gaps in the case of pyrite are produced by splitting the 3d conditions of the iron in energetically lower occupied $t_{2g}$ and unoccupied $e_g$ conditions. The split is caused by the octahedral ligand field of the sulphur, which is easily deformed and which leads to a further and in this case significant split in the energy level.

Figure 3:
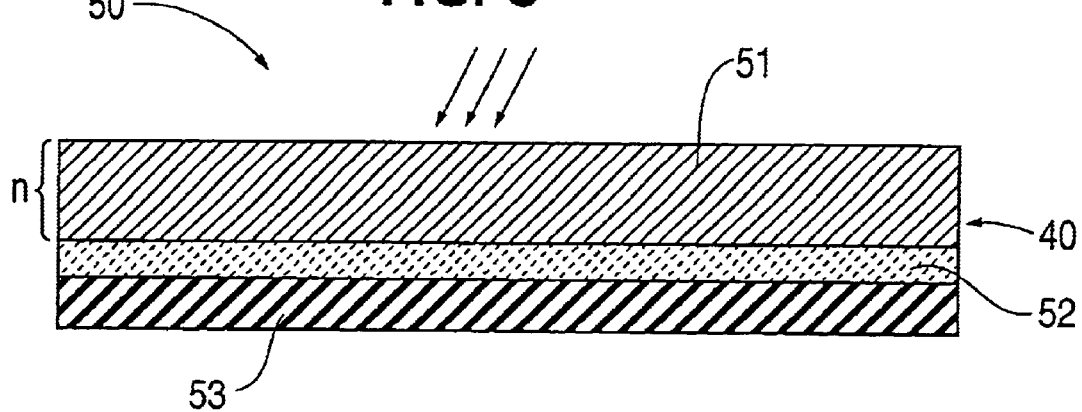

FIG. 3 on the other hand shows schematically a cross-section of a semiconductor component 50 in accordance with the invention, which is formed from at least one upper layer of pyrite 51, which forms the semiconductor base material 40, and which consists of a layer of boron 52 and a layer of phosphorus 53. The pyrite 51 is arranged on the upper side, which initially accepts the effects of the sun radiation or similar. With this arrangement of layer however, in accordance with the invention, a compound is formed with the adjacent basic pyrite material 51, or the phosphorus 53 and the boron 52 are integrated into the adjacent basic pyrite material. The conductive elements can be arranged such that they come into contact with the layers 51, 52, 53, for which no further details are given.

In contrast to the semiconductor base material 40 produced by layers as shown in FIG. 3, one or more layers of boron and/or one or more layers of phosphorus can be arranged laterally in the pyrite target produced as a single crystal for example.

The semiconductor base materials 20 and/or 40 for these solar cells 10, 50 in accordance with the invention can be produced by various methods. The pyrite in the composition of $FeS_2$ can be obtained either as a natural material or produced synthetically from iron and sulphur.

When using natural pyrite crystals as the semiconductor base material, this pyrite, which by has a net charge carrying concentration of approx. $10^{15}$ $cm^{-3}$, must be treated by a recognized multi-zone cleaning process, so that it achieves a defined purity of 99.9%. Also, the compound or dopant materials, phosphorus and boron respectively, should also achieve a purity of 99.9%, in order to be able to produce cells in accordance with the invention of the highest quality from same.

Various methods can be used for the artificial production or synthesis of the semiconductor base material pyrite, whereby the base material is also treated by a multi-zone cleaning process, in order to achieve the highest possible degree of purity from the chemical compound.

The production method is suitable for gaseous phase transport (CVT), for which the temperature gradient for producing the iron-sulphur compound should be between 250° and 1200° C. If pyrite is used as a natural base material, the temperature on the cooler side may vary between 250° and 850° C. As a transport medium for feeding the sulphur to the iron, bromine ($Br_2$ $FeBr_3$) or another material may be used.

Crystal synthesis may occur for example in a sodium poly-sulphate solution. The pyrite can be synthesised from the cleaned base elements, iron and sulphur, both at the standard temperature gradients between 250° and 1200° C. and also at a gradient of 200° to 1400° C. The CVT methods offer improved reproducibility during production and absolute pure crystals can be achieved in this way.

For achieving large single-crystal pyrite pieces, the production method which uses molten solution with tellurium, $BrCl_2Na$, $S_2$ or similar materials, is used.

Another production variant for pyrite exists in RF sputter. This occurs in a sputter unit, where a pyrite target is sputtered with an argon-sulphur-plasma. The flow of argon is usually between 0.1 and 300 ml/min and the sulphur is obtained by vaporising elementary sulphur. During separation, the working pressure of 0.01 mbar or higher, or even lower is maintained. The Self-Bias DC Potential used is set at 0 to 400 volts. The substrate temperature is selected from the range of 80° to 950° C. With this process, a poly-crystal structure can in principle be produced.

To produce the semiconductor components in accordance with the invention as a thin film, an incongruent material system can be used. The reactive sputter produced from a target of pyrite, the MOCVD methods and spray pyrolysis are suitable. Moreover, the method of thermal evaporation assisted by a conveying system which transports small quantities of a powder compound to the hot evaporation source, guarantees that the material, dependent upon the high temperature, is almost completely vaporised. This type of vaporisation offers the benefit that influence can be exerted on both the stoichiometry and also a potential doping, since for example, the dopant can be added directly to the powder compound. If iron films are sulphurised, either purely thermally or with the aid of plasma, it is possible to start from pure base materials.

The thickness of the active layer has a major influence on the efficiency of the solar cell. To estimate the efficiency and the required cell parameters, appropriate boundary areas can be specified.

For doping or combining the semiconductor base material with phosphorus and boron respectively, the preference is to use the latter in a mass percentage of $10^{-6}$ to 20% of the base material. This depends on the required properties of the finished semiconductor component.

The semiconductor component in accordance with the invention may also be produced as a so-called tandem cell. In this case, a dopant layer of pyrite and one further p and n layer from another semiconductor crystal such as silicon, gallium arsenide or from another available material can create a combined effect. With this type of semiconductor component, maximum use can be made of the spectrum, if these various semiconductor base materials were able to cover the energy gap of between 1.0 and 1.8 eV.

Figure 4:
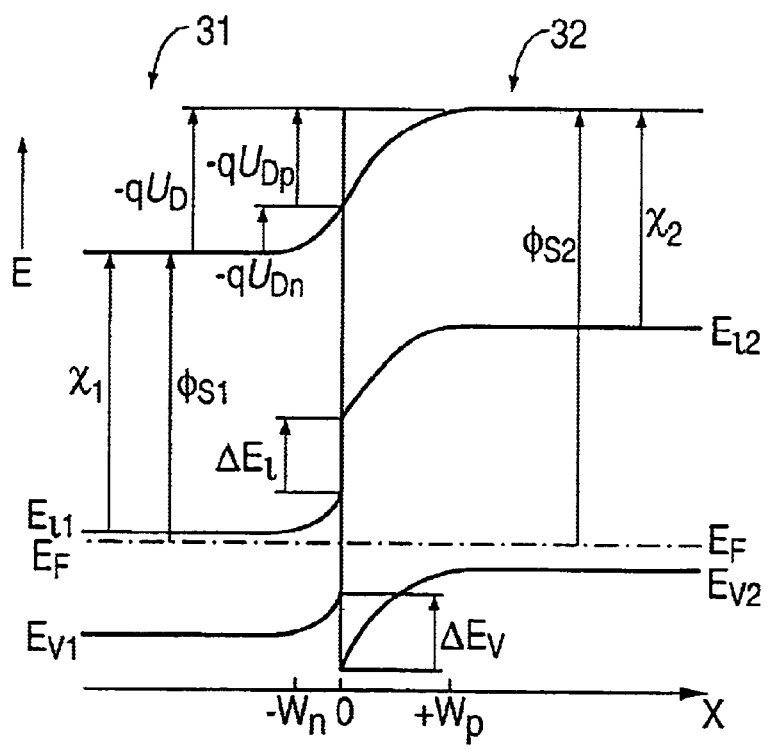

In accordance with FIG. 4 and within the scope of this invention, heterojunctions between various semiconductor components can be used, as explained in detail above in respect of the type variant shown in FIG. 3. The condition however, is that the lattice constants and the thermal expansion coefficients of the two materials do not vary greatly. As an example, in accordance with the invention, a p-semiconductor 31 from pyrite can be combined with a n-conductive semiconductor 32 from a different material. This heterojunction causes band discontinuity which is used in an innovative manner to influence the charge carrier transport. With the two separate semiconductor materials 31 and 32, the band gaps $E_G$, the work function $\ddot{O}_s$ and the electron affinity $\chi$ are different.

Specially developed epitaxial growth methods are recognized for producing heterojunctions, which are also used in relation to the semiconductor base material used in this invention. Both the molecular beam epitaxy (MBE) and the gaseous epitaxy (MOCVD) exist in the form of gaseous deposition from metal-organic compounds.

In the case of the thin film solar cell with a heterojunction, phosphorus and boron are preferably integrated or doped, through an ion implantation, into the surface of the semiconductor base material pyrite, which occurs with the aid of particle accelerators. Thus, after ionization, the dopant atoms are increased to a high level of energy and injected into the base material, where, after a characteristic penetration depth, they are arrested and remain. With this implantation process, the lattice of the semiconductor crystal sustains considerable damage and it has to be regenerated by thermal treatment. Thus, the implanted impurities diffuse and are simultaneously integrated into the lattice. Accordingly, compound profiles form from ion implantations and impurity diffusions.

The molecular beam epitaxy (MBE) process is a special vapour deposition method. The material is vaporised in hot cylinder-shaped pipes with a small front opening. The size of this opening and the vapour pressure created in the furnace by the heat determine the material transport for the target. An ultra-high vacuum, controlled by a mass analyser and a cooled shielding plate create very clean crystal layers. The structure of these crystal layers can be controlled quasionline by so-called RHEED measurements (Reflected High Energy Electron Difraction) and their layer thicknesses are created precisely by a temperature regulation and quick sealing to a layer of atoms.

In the case of a multi-layer structure, the semi-conductor component may have up to a hundred layers, i.e. n in FIG. 3=1 to 100. It would therefore be feasible for the semiconductor component shown in FIG. 3 to be created from more than three different layers, in this way, several layers of pyrite and if appropriate, several layers from boron and/or phosphorus could be used.

The semiconductor component used as pyrite—as described above—may be created—within the scope of the invention—not only as a single or multi-layer solid matter solar cell, but also as a thin film solar cell, as a MIS solar cell, a photo-chemical cell or similar.

The semiconductor component in accordance with the invention is used to the best advantage as a solar cell, because as such, it achieves an extraordinarily high degree of efficiency. Clearly, this semiconductor component may also be used for other purposes, such as a diode, a transistor, thyristor or similar.

A semiconductor component in accordance with the invention could in theory also function if a layer of pyrite and a compound with same were produced on the basis of boron (B) or phosphorus (P).

I claim:

1. Semiconductor component with at least one semiconductor base material consisting of a mono or a polycrystalline structure, which consists at least in part of pyrite with the chemical composition $FeS_2$ and which is cleaned for the purpose of achieving a defined degree of purity, wherein the semiconductor base material at least in part of pyrite with the chemical composition $FeS_2$ is combined or doped at least with boron.

2. Semiconductor component in accordance with claim 1, wherein the semiconductor base material $FeS_2$ is combined or doped with phosphorus (P).

3. Semiconductor component in accordance with claim 1, wherein the semiconductor base material $FeS_2$ is combined or doped with boron (B) and with phosphorus (P).

4. Semiconductor component in accordance with claim 1, wherein, with a multi-layered semiconductor base material, has at least one p or n layer from pyrite and at least one n or p layer from a different semiconductor.

5. Semiconductor component in accordance with claim 1, wherein the concentration of each of elements integrated into the base material has a mass percentage of between $10^{-6}$ and 20.

6. Semiconductor component in accordance with claim 1, wherein the semiconductor component is created as a single or multilayer solar cell, a thin film solar cell, an MIS solar cell or a photo-chemical cell.

7. Semiconductor component in accordance with claim 1, wherein the pyrite has a thermal expansion coefficient at 90 to 300 K of $4.5 \times 10^{-6}$ and at 300 to 500 $K^{-1}$, of $8.4 \times 10^{-1}$ $K^{-1}$.

8. Semiconductor component in accordance with claim 1, wherein pyrite with the chemical composition $FeS_2$, has an elementary cell of 12 atoms and the unit cell has a length of approximately 5.4185 Angstroms, whereby the basic forms of the crystal habitus of the pyrite occur as a hexahedral, a cubic shape, a pentagonal dodecagon or an octahedron.

9. Semiconductor component in accordance with claim 1, wherein semiconductor base material created from pyrite is treated by a multi-zone cleaning process.

10. Semiconductor component in accordance with claim 1, wherein in the case of a multi-layered structure, the semiconductor component has up to one hundred layers.

11. Semiconductor component in accordance with claim 1 which is a solar cell.

12. Semiconductor component in accordance with claim 9 having a purity of 99.9999%.

* * * * *